(12) United States Patent (10) Patent No.: US 9,423,083 B2
Osinski et al. (45) Date of Patent: Aug. 23, 2016

(54) MULTIPLE QUANTUM DOT (QD) DEVICE

(71) Applicants: Julian Osinski, Woodside, CA (US); Juanita N. Kurtin, Hillsboro, OR (US); Benjamin Daniel Mangum, Tualatin, OR (US); Ron Nelson, Portland, OR (US)

(72) Inventors: Julian Osinski, Woodside, CA (US); Juanita N. Kurtin, Hillsboro, OR (US); Benjamin Daniel Mangum, Tualatin, OR (US); Ron Nelson, Portland, OR (US)

(73) Assignee: Pacific Light Technologies, Corp., Portland, OR (US)

( * ) Notice: Subject to any disclaimer, the term of this patent is extended or adjusted under 35 U.S.C. 154(b) by 171 days.

(21) Appl. No.: 14/201,021

(22) Filed: Mar. 7, 2014

(65) Prior Publication Data

US 2014/0254131 A1 Sep. 11, 2014

Related U.S. Application Data

(60) Provisional application No. 61/774,496, filed on Mar. 7, 2013, provisional application No. 61/776,625, filed on Mar. 11, 2013.

(51) Int. Cl.
*F21V 9/16* (2006.01)
*F21K 99/00* (2016.01)
*B82Y 20/00* (2011.01)
*F21V 29/70* (2015.01)
*H01L 33/50* (2010.01)

(52) U.S. Cl.
CPC . *F21K 9/56* (2013.01); *B82Y 20/00* (2013.01); *F21V 9/16* (2013.01); *F21V 29/70* (2015.01); *H01L 33/504* (2013.01); *Y10S 977/774* (2013.01)

(58) Field of Classification Search
CPC ............. F21K 9/56; B82Y 20/00; F21V 9/16; F21V 29/70; Y10S 977/774; H01L 33/504
USPC ...................... 362/84, 357, 231; 257/98, 100; 313/503; 977/774
See application file for complete search history.

(56) References Cited

U.S. PATENT DOCUMENTS

| | | | |
|---|---|---|---|
| 2006/0071218 A1* | 4/2006 | Takeda | B82Y 10/00 257/79 |
| 2009/0001399 A1* | 1/2009 | Diana | H01L 33/507 257/98 |
| 2014/0022779 A1* | 1/2014 | Su | H01L 33/504 362/231 |
| 2015/0112612 A1* | 4/2015 | Walt | G06F 19/24 702/32 |

FOREIGN PATENT DOCUMENTS

WO WO 2012135744 A2 * 10/2012 ............ H01L 33/504

* cited by examiner

*Primary Examiner* — Anh Mai
*Assistant Examiner* — Glenn Zimmerman
(74) *Attorney, Agent, or Firm* — Blakely Sokoloff Taylor & Zafman LLP

(57) ABSTRACT

A lighting apparatus includes a housing structure, a light source supported within the housing structure, and a light coversion layer disposed above the light source. The light conversion layer comprises a plurality of non- or low-self absorbing quantum dots (QDs) embedded in a matrix material, each QD having a different light emission profile that is a function of a size and/or composition of the QD, each of the plurality of QDs selected to achieve a defined spectral emission profile for the lighting device when the plurality of QDs is illuminated by the light source.

18 Claims, 15 Drawing Sheets

WHITE LIGHT

MULTIPLE QUANTUM DOT (QD) DEVICE

CROSS-REFERENCE TO RELATED APPLICATIONS

This application claims the benefit of U.S. Provisional Application No. 61/774,496, filed Mar. 7, 2013, the entire contents of which are hereby incorporated by reference herein, and of U.S. Provisional Application No. 61/776,625, filed Mar. 11, 2013, the entire contents of which are hereby incorporated by reference herein.

TECHNICAL FIELD

Embodiments of the present invention are in the field of quantum dots and, in particular, devices including a combination of different quantum dots with different emission colors.

BACKGROUND

There are several variables to optimize for LED performance in LED lighting or LED displays, for example, color quality and power conversion efficiency.

The metric for color quality is Color Rendering Index (CRI). A perfect blackbody radiator is used as a basis for the CRI calculation. As such, a blackbody radiation spectrum has the highest possible CRI value of 100. However, a blackbody radiator has a considerable amount of emitted power in regions to which the human eye is not sensitive. To obtain an optimal CRI, the blackbody radiation spectrum is truncated to the human-visible range of the spectrum. However, the particular blackbody spectrum is dependent on the temperature of the blackbody, which is known as the Correlated Color Temperature (CCT).

A primary metric for power conversion efficiency is Luminous Efficacy of Radiation (LER). The goal in efficient lighting design is to optimize the amount of electrical power that is converted into light energy. However, the human eye is more sensitive to some wavelengths of light compared to other wavelengths of light, being the most sensitive in the green range (approximately 495 nm-570 nm) of the visible spectrum (approximately 380 nm-780 nm). This means a given amount of light can be perceived as having different intensities depending on the wavelength of that light. In order to achieve the highest possible LER, all emitted light should match the peak sensitivity of the human eye (that is, light in the green range).

In order to balance these various parameters, lighting designers attempt to simultaneously optimize both the CRI and LER for a given CCT value. In prior art LED lighting, this may be done through the use of down-conversion conventional phosphors (i.e., Cerium doped: Yttrium Aluminum Garnet (Ce:Yag-$Y_3Al_5O_{12}$))—materials that convert blue light to redder (lower energy) wavelengths. While there are many such phosphors available, their emission profiles are broad and are generally not tunable. These limitations mean that many desired theoretical emission profiles simply cannot be realized with these materials. What is needed are quantum dot down-conversion phosphor materials that are both tunable and have a narrow spectral emission profile, meaning that almost any desired emission spectrum can be created through the use of these materials. Such materials would represent a major advance in LED lighting in that any theoretical optical emission spectrum may be readily realized, thus removing the limitations presented by conventional phosphor materials.

SUMMARY

A lighting apparatus in one embodiment of the invention includes a housing structure, a light source supported within the housing structure, and a light conversion layer disposed above the light source. The light conversion layer comprises a plurality of quantum dots (QDs) embedded in a matrix material, each QD having a different light emission profile that is a function of a size of the QD, each of the plurality of QDs selected to achieve a defined spectral emission profile for the lighting device when the plurality of QDs is illuminated by the light source.

DETAILED DESCRIPTION

Figure 1:
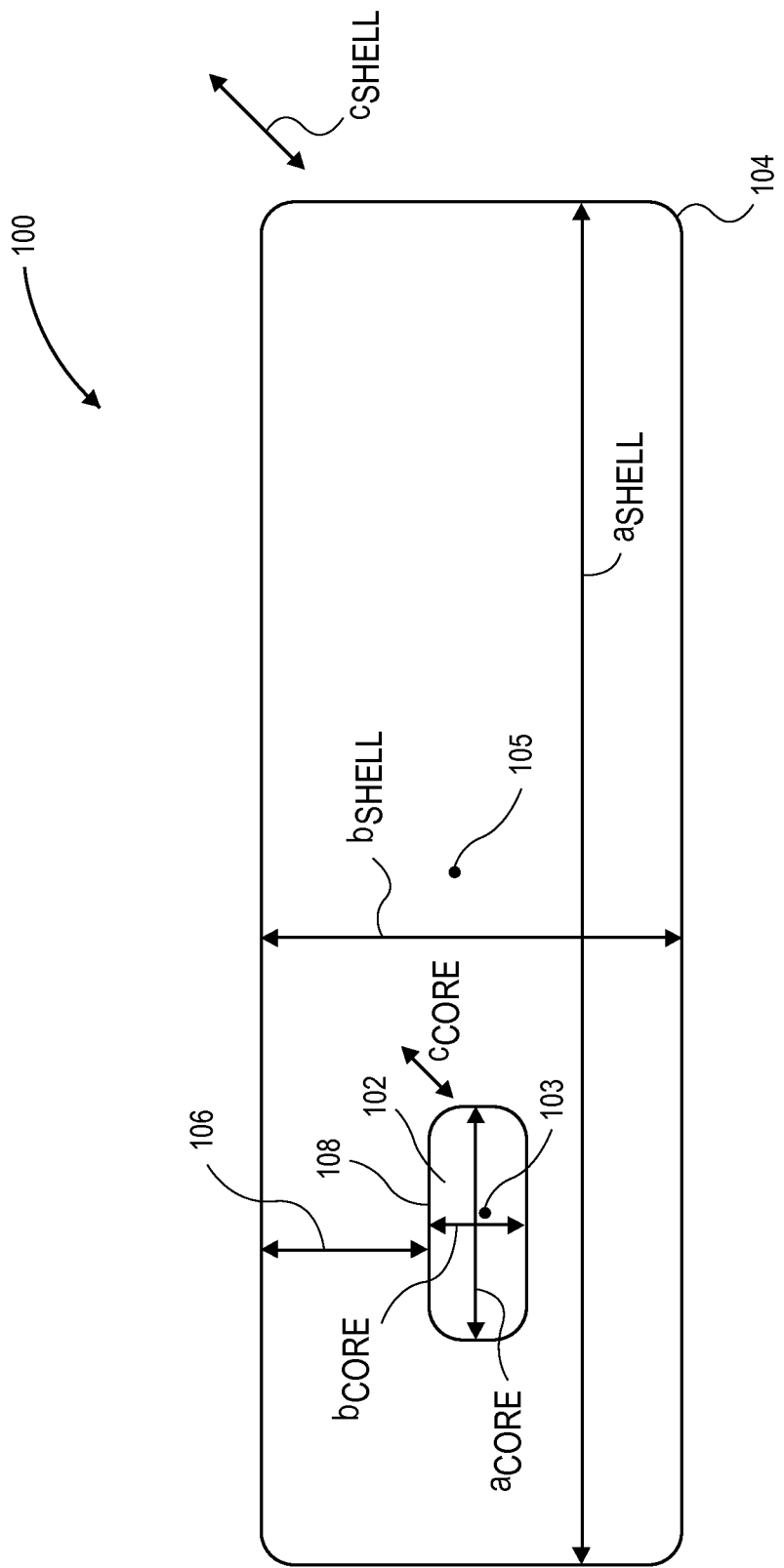
FIG. 1 illustrates a schematic of a cross-sectional view of a quantum dot suitable for delivery by approaches described herein, in accordance with an embodiment of the present invention.

FIG. 1 illustrates a schematic of a cross-sectional view of a quantum dot, in accordance with an embodiment of the present invention. Referring to FIG. 1, a semiconductor structure (e.g., a quantum dot structure) 100 includes a nano-crystalline core 102 surrounded by a nano-crystalline shell 104. The nano-crystalline core 102 has a length axis ($a_{CORE}$), a width axis ($b_{CORE}$) and a depth axis ($c_{CORE}$), the depth axis provided into and out of the plane shown in FIG. 1. Likewise, the nano-crystalline shell 104 has a length axis ($a_{SHELL}$), a width axis ($b_{SHELL}$) and a depth axis ($c_{SHELL}$), the depth axis provided into and out of the plane shown in FIG. 1. The nano-crystalline core 102 has a center 103 and the nano-crystalline shell 104 has a center 105. The nano-crystalline shell 104 surrounds the nano-crystalline core 102 in the b-axis direction by an amount 106, as is also depicted in FIG. 1.

The following are attributes of a quantum dot that may be tuned for optimization, with reference to the parameters provided in FIG. 1, in accordance with embodiments of the present invention. Nano-crystalline core 102 diameter (a, b or c) and aspect ratio (e.g., a/b) can be controlled for rough tuning for emission wavelength (a higher value for either providing increasingly red emission). A smaller overall nano-crystalline core provides a greater surface to volume ratio. The width of the nano-crystalline shell along 106 may be tuned for yield optimization and quantum confinement providing approaches to control red-shifting and mitigation of surface effects. However, strain considerations must be accounted for when optimizing the value of thickness 106. The length ($a_{SHELL}$) of the shell is tunable to provide longer radiative decay times as well as increased light absorption. The overall aspect ratio of the structure 100 (e.g., the greater of $a_{SHELL}/b_{SHELL}$ and $a_{SHELL}/c_{SHELL}$) may be tuned to directly impact PLQY. Meanwhile, overall surface/volume ratio for 100 may be kept relatively smaller to provide lower surface defects, and provide higher photoluminescence. Referring again to FIG. 1, the shell/core interface 108 may be tailored to avoid dislocations and strain sites. In one such embodiment, a high quality interface is obtained by tailoring one or more of injection temperature and mixing parameters, the use of surfactants, and control of the reactivity of precursors.

In accordance with an embodiment of the present invention, a high PLQY quantum dot is based on a core/shell pairing using an anisotropic core. With reference again to FIG. 1, an anisotropic core is a core having one of the axes $a_{CORE}$, $b_{CORE}$ or $c_{CORE}$ different from one or both of the remaining axes. An aspect ratio of such an anisotropic core is determined by the longest of the axes $a_{CORE}$, $b_{CORE}$ or $c_{CORE}$ divided by the shortest of the axes $a_{CORE}$, $b_{CORE}$ or $c_{CORE}$ to provide a number greater than 1 (an isotropic core has an aspect ratio of 1). It is to be understood that the outer surface of an anisotropic core may have rounded or curved edges (e.g., as in an ellipsoid) or may be faceted (e.g., as in a stretched or elongated tetragonal or hexagonal prism) to provide an aspect ratio of greater than 1 (note that a sphere, a tetragonal prism, and a hexagonal prism are all considered to have an aspect ratio of 1 in keeping with embodiments of the present invention).

A workable range of aspect ratio for an anisotropic nano-crystalline core for a quantum dot may be selected for maximization of PLQY. For example, a core essentially isotropic may not provide advantages for increasing PLQY, while a core with too great an aspect ratio (e.g., 2 or greater) may present challenges synthetically and geometrically when forming a surrounding shell. Furthermore, embedding the core in a shell composed of a material different than the core may also be used enhance PLQY of a resulting quantum dot.

Accordingly, in an embodiment, a semiconductor structure includes an anisotropic nano-crystalline core composed of a first semiconductor material and having an aspect ratio between, but not including, 1.0 and 2.0. The semiconductor structure also includes a nano-crystalline shell composed of a second, different, semiconductor material at least partially surrounding the anisotropic nano-crystalline core. In one such embodiment, the aspect ratio of the anisotropic nano-crystalline core is approximately in the range of 1.01-1.2 and, in a particular embodiment, is approximately in the range of 1.1-1.2. In the case of rounded edges, then, the nano-crystalline core may be substantially, but not perfectly, spherical. However, the nano-crystalline core may instead be faceted. In an embodiment, the anisotropic nano-crystalline core is disposed in an asymmetric orientation with respect to the nano-crystalline shell, as described in greater detail in the example below.

Another consideration for maximization of PLQY in a quantum dot structure is to provide an asymmetric orientation of the core within a surrounding shell. For example, referring again to FIG. 1, the center 103 of the core 102 may be misaligned with (e.g., have a different spatial point than) the center 101 of the shell 104. In an embodiment, a semiconductor structure includes an anisotropic nano-crystalline core composed of a first semiconductor material. The semiconductor structure also includes a nano-crystalline shell composed of a second, different, semiconductor material at least partially surrounding the anisotropic nano-crystalline core. The anisotropic nano-crystalline core is disposed in an asymmetric orientation with respect to the nano-crystalline shell. In one such embodiment, the nano-crystalline shell has a long axis (e.g., $a_{SHELL}$), and the anisotropic nano-crystalline core is disposed off-center along the long axis. In another such embodiment, the nano-crystalline shell has a short axis (e.g., $b_{SHELL}$), and the anisotropic nano-crystalline core is disposed off-center along the short axis. In yet another embodiment, however, the nano-crystalline shell has a long axis (e.g., $a_{SHELL}$) and a short axis (e.g., $b_{SHELL}$), and the anisotropic nano-crystalline core is disposed off-center along both the long and short axes.

With reference to the above described nano-crystalline core and nano-crystalline shell pairings, in an embodiment, the nano-crystalline shell completely surrounds the anisotropic nano-crystalline core. In an alternative embodiment, however, the nano-crystalline shell only partially surrounds the anisotropic nano-crystalline core, exposing a portion of the anisotropic nano-crystalline core, e.g., as in a tetrapod geometry or arrangement. In an embodiment, the nano-crystalline shell is an anisotropic nano-crystalline shell, such as a nano-rod, that surrounds the anisotropic nano-crystalline core at an interface between the anisotropic nano-crystalline shell and the anisotropic nano-crystalline core. The anisotropic nano-crystalline shell passivates or reduces trap states at the interface. The anisotropic nano-crystalline shell may also, or instead, deactivate trap states at the interface.

With reference again to the above described nano-crystalline core and nano-crystalline shell pairings, in an embodiment, the first and second semiconductor materials (core and shell, respectively) are each materials such as, but not limited to, Group II-VI materials, Group III-V materials, Group IV-VI materials, Group I-III-VI materials, or Group II-IV-VI materials and, in one embodiment, are mono-crystalline. In one such embodiment, the first and second semiconductor materials are both Group II-VI materials, the first semiconductor material is cadmium selenide (CdSe), and the second semiconductor material is one such as, but not limited to, cadmium sulfide (CdS), zinc sulfide (ZnS), or zinc selenide (ZnSe). In an embodiment, the semiconductor structure further includes a nano-crystalline outer shell at least partially surrounding the nano-crystalline shell and, in one embodiment, the nano-crystalline outer shell completely surrounds the nano-crystalline shell. The nano-crystalline outer shell is composed of a third semiconductor material different from the first and second semiconductor materials. In a particular such embodiment, the first semiconductor material is cadmium selenide (CdSe), the second semiconductor material is cadmium sulfide (CdS), and the third semiconductor material is zinc sulfide (ZnS).

With reference again to the above described nano-crystalline core and nano-crystalline shell pairings, in an embodiment, the semiconductor structure (i.e., the core/shell pairing in total) has an aspect ratio approximately in the range of 1.5-10 and, 3-6 in a particular embodiment. In an embodiment, the nano-crystalline shell has a long axis and a short axis. The long axis has a length approximately in the range of 5-40 nanometers. The short axis has a length approximately in the range of 1-5 nanometers greater than a diameter of the anisotropic nano-crystalline core parallel with the short axis of the nano-crystalline shell. In a specific such embodiment, the anisotropic nano-crystalline core has a diameter approximately in the range of 2-5 nanometers. The thickness of the nano-crystalline shell on the anisotropic nano-crystalline core along a short axis of the nano-crystalline shell is approximately in the range of 1-5 nanometers of the second semiconductor material.

With reference again to the above described nano-crystalline core and nano-crystalline shell pairings, in an embodiment, the anisotropic nano-crystalline core and the nano-crystalline shell form a quantum dot. In one such embodiment, the quantum dot has a photoluminescence quantum yield (PLQY) of at least 90%. Emission from the quantum dot may be mostly, or entirely, from the nano-crystalline core. For example, in an embodiment, emission from the anisotropic nano-crystalline core is at least approximately 75% of the total emission from the quantum dot. An absorption spectrum and an emission spectrum of the quantum dot may be essentially non-overlapping. For example, in an embodiment, an absorbance ratio of the quantum dot based on absorbance at 400 nanometers versus absorbance at an exciton peak for the quantum dot is approximately in the range of 5-35.

In an embodiment, a quantum dot based on the above described nano-crystalline core and nano-crystalline shell pairings is a down-converting quantum dot. However, in an alternative embodiment, the quantum dot is an up-shifting quantum dot. In either case, a lighting apparatus may include a light emitting diode and a plurality of quantum dots such as those described above. The quantum dots may be applied proximal to the LED and provide down-conversion or up-shifting of light emitted from the LED. Thus, semiconductor structures according to the present invention may be advantageously used in solid state lighting. The visible spectrum includes light of different colors having wavelengths between about 380 nm and about 780 nm that are visible to the human eye. An LED will emit a UV or blue light which is down-converted (or up-shifted) by semiconductor structures described herein. Any suitable ratio of emission color from the semiconductor structures may be used in devices of the present invention. LED devices according to embodiments of the present invention may have incorporated therein sufficient quantity of semiconductor structures (e.g., quantum dots) described herein capable of down-converting any available blue light to red, green, yellow, orange, blue, indigo, violet or other color. These structures may also be used to downconvert or upconvert lower energy light (green, yellow, etc) from LED devices, as long as the excitation light produces emission from the structures.

The above described semiconductor structures, e.g., quantum dots, suitable for delivery by approaches described herein may be fabricated to further include one or more compositional transition layers between portions of the structures, e.g., between core and shell portions. Inclusion of such a transition layer may reduce or eliminate any performance inefficiency associated with otherwise abrupt junctions between the different portions of the structures. For example, the inclusion of a compositional transition layer may be used to suppress Auger recombination within a quantum dot structure. Auger recombination events translate to energy from one exciton being non-radioactively transferred to another charge carrier. Such recombination in quantum dots typically occurs on sub-nanosecond time scales such that a very short multi-exciton lifetime indicates non-radiative recombination, while higher nanosecond bi-exciton lifetimes indicate radiative recombination. A radiative bi-exciton has a lifetime approximately 2-4 times shorter than radiative single exciton.

More specifically, as is described in greater detail below in association with FIGS. 2-4, an optimal particle (e.g., quantum dot structure) may have one or more of a high aspect ratio, a large volume relative to other quantum dot hetero-structures, and graded or alloyed transitions between different semiconductor materials. The graded or alloyed transitions can be used to render a compositional and structural transition from one component (such as a quantum dot core) to another component (such as a quantum dot shell) a smooth function rather than a step function. In one embodiment, the terms "graded," "gradient," or "grading" are used to convey gradual transitioning from one semiconductor to another. In one embodiment, the terms "alloy," "alloyed," or "alloying" are used to convey an entire volume having a fixed intermediate composition. In more specific embodiments, core or seed volume is maximized relative to shell volume for a given emission color. A graded or alloyed core/shell transition layer may be included between the two volumes.

Figure 2:
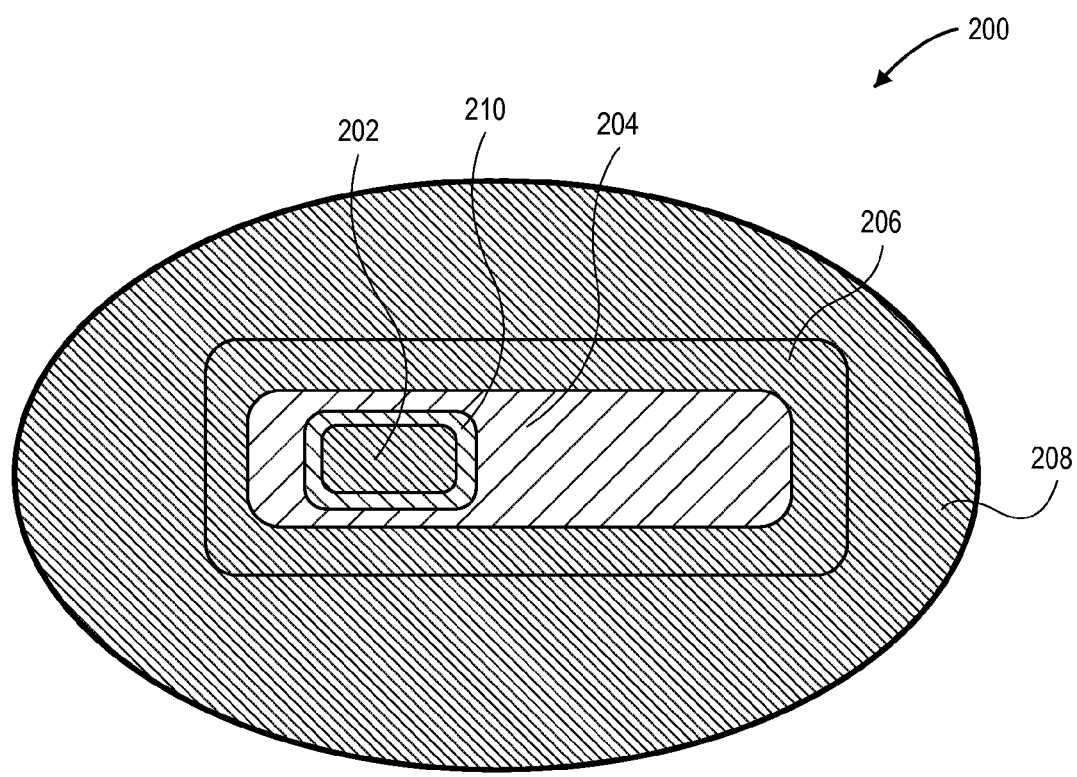
FIG. 2 illustrates a cross-sectional view of a semiconductor structure having a nano-crystalline core and nano-crystalline shell pairing with one compositional transition layer, in accordance with an embodiment of the present invention.

In a first example, FIG. 2 illustrates a cross-sectional view of a semiconductor structure having a nano-crystalline core and nano-crystalline shell pairing with one compositional transition layer, in accordance with an embodiment of the present invention.

Referring to FIG. 2, a semiconductor structure 200 includes a nano-crystalline core 202 composed of a first semiconductor material. A nano-crystalline shell 204 composed of a second, different, semiconductor material at least partially surrounds the nano-crystalline core 202. A compositional transition layer 210 is disposed between, and in contact with, the nano-crystalline core 202 and nano-crystalline shell 204. The compositional transition layer 210 has a composition intermediate to the first and second semiconductor materials.

In an embodiment, the compositional transition layer 210 is an alloyed layer composed of a mixture of the first and second semiconductor materials. In another embodiment, the compositional transition layer 210 is a graded layer composed of a compositional gradient of the first semiconductor material proximate to the nano-crystalline core 202 through to the second semiconductor material proximate to the nano-crystalline shell 204. In either case, in a specific embodiment, the compositional transition layer 210 has a thickness approximately in the range of 1.5-2 monolayers. Exemplary embodiments include a structure 200 where the first semiconductor material is cadmium selenide (CdSe), the second semiconductor material is cadmium sulfide (CdS), and the compositional transition layer 210 is composed of $CdSe_xS_y$, where $0<x<1$ and $0<y<1$, or where the first semiconductor material is cadmium selenide (CdSe), the second semiconductor material is zinc selenide (ZnSe), and the compositional transition layer 210 is composed of $Cd_xZn_ySe$, where $0<x<1$ and $0<y<1$.

In accordance with an embodiment of the present invention, the compositional transition layer 210 passivates or reduces trap states where the nano-crystalline shell 204 surrounds the nano-crystalline core 202. Exemplary embodiments of core and/or shell parameters include a structure 200 where the nano-crystalline core 202 is an anisotropic nano-crystalline core having an aspect ratio between, but not including, 1.0 and 2.0 (in a specific embodiment, approximately in the range of 1.01-1.2), and the nano-crystalline shell is an anisotropic nano-crystalline shell having an aspect ratio approximately in the range of 4-6.

In an embodiment, the nano-crystalline shell 204 completely surrounds the nano-crystalline core 202, as depicted in FIG. 2. In an alternative embodiment, however, the nano-crystalline shell 204 only partially surrounds the nano-crystalline core 202, exposing a portion of the nano-crystalline core 202. Furthermore, in either case, the nano-crystalline core 202 may be disposed in an asymmetric orientation with respect to the nano-crystalline shell 204. In one or more embodiments, semiconductor structures such as 200 are fabricated to further include a nano-crystalline outer shell 206 at least partially surrounding the nano-crystalline shell 204. The nano-crystalline outer shell 206 may be composed of a third semiconductor material different from the first and second semiconductor materials, i.e., different from the materials of the core 202 and shell 204. The nano-crystalline outer shell 206 may completely surround the nano-crystalline shell 204 or may only partially surround the nano-crystalline shell 204, exposing a portion of the nano-crystalline shell 204.

For embodiments including a nano-crystalline outer shell, an additional compositional transition layer may be included. Thus, in a second example, FIG. 3 illustrates a cross-sectional view of a semiconductor structure having a nano-crystalline core/nano-crystalline shell/nano-crystalline outer shell combination with two compositional transition layers, in accordance with an embodiment of the present invention.

Figure 3:
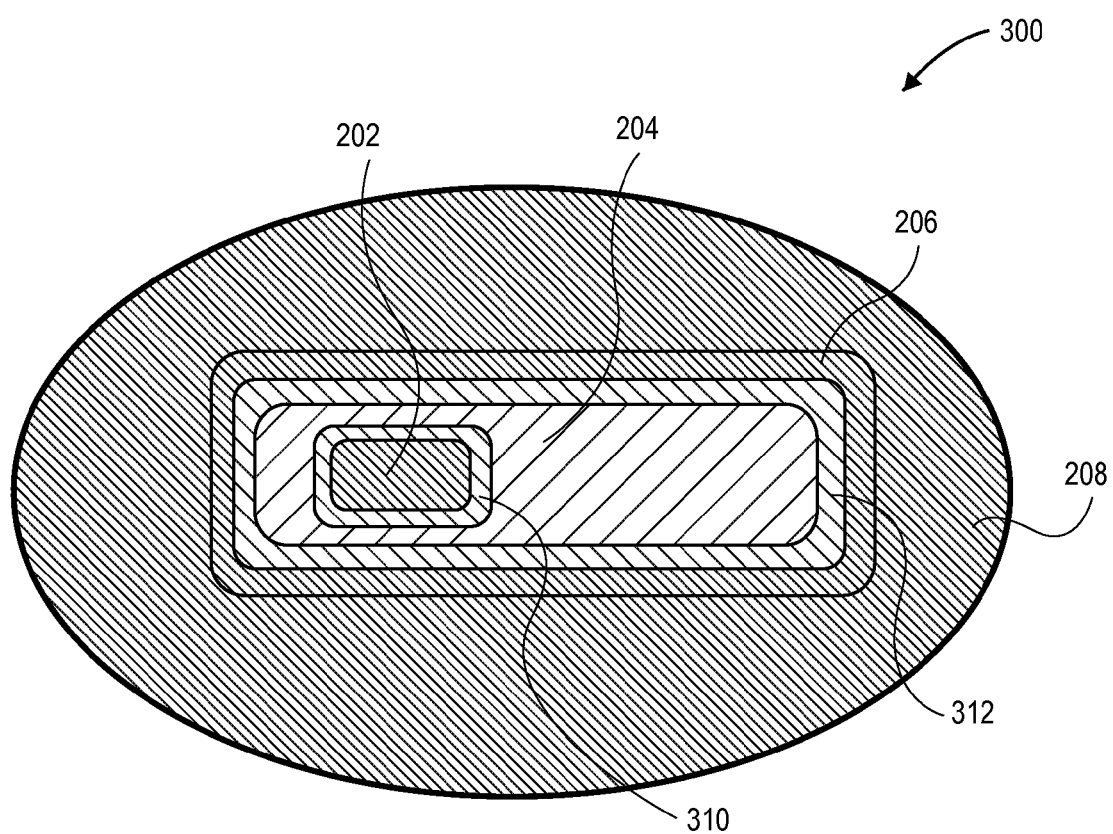
FIG. 3 illustrates a cross-sectional view of a semiconductor structure having a nano-crystalline core/nano-crystalline shell/nano-crystalline outer shell combination with two compositional transition layers, in accordance with an embodiment of the present invention.

Referring to FIG. 3, a semiconductor structure 300 includes the nano-crystalline core 202, nano-crystalline shell 204, nano-crystalline outer shell 206 and compositional transition layer 210 of structure 200. However, in addition, semiconductor structure 300 includes a second compositional transition layer 312 disposed between, and in contact with, the nano-crystalline shell 204 and the nano-crystalline outer shell 206. The second compositional transition layer 312 has a composition intermediate to the second and third semiconductor materials, i.e., intermediate to the semiconductor materials of the shell 204 and outer shell 206.

In an embodiment, the second compositional transition layer 312 is an alloyed layer composed of a mixture of the second and third semiconductor materials. In another embodiment, the second compositional transition layer 312 is a graded layer composed of a compositional gradient of the second semiconductor material proximate to the nano-crystalline shell 204 through to the third semiconductor material proximate to the nano-crystalline outer shell 206. In either case, in a specific embodiment, the second compositional transition layer 312 has a thickness approximately in the range of 1.5-2 monolayers. Exemplary embodiments include a structure 300 where the first semiconductor material is cadmium selenide (CdSe), the second semiconductor material is cadmium sulfide (CdS), the third semiconductor material is zinc sulfide (ZnS), and the second compositional transition layer 312 is composed of $Cd_xZn_yS$, where $0<x<1$ and $0<y<1$, or the first semiconductor material is cadmium selenide (CdSe), the second semiconductor material is zinc selenide (ZnSe), the third semiconductor material is zinc sulfide (ZnS), and the second compositional transition layer 312 is composed of $ZnSe_xS_y$, where $0<x<1$ and $0<y<1$. In accordance with an embodiment of the present invention, the second compositional transition layer 312 passivates or reduces trap states where the nano-crystalline outer shell 206 surrounds the nano-crystalline shell 204.

For other embodiments including a nano-crystalline outer shell, an outer compositional transition layer may be included without including an inner compositional transition layer. Thus, in a third example, FIG. 4 illustrates a cross-sectional view of a semiconductor structure having a nano-crystalline core/nano-crystalline shell/nano-crystalline outer shell combination with one compositional transition layer, in accordance with an embodiment of the present invention.

Figure 4:
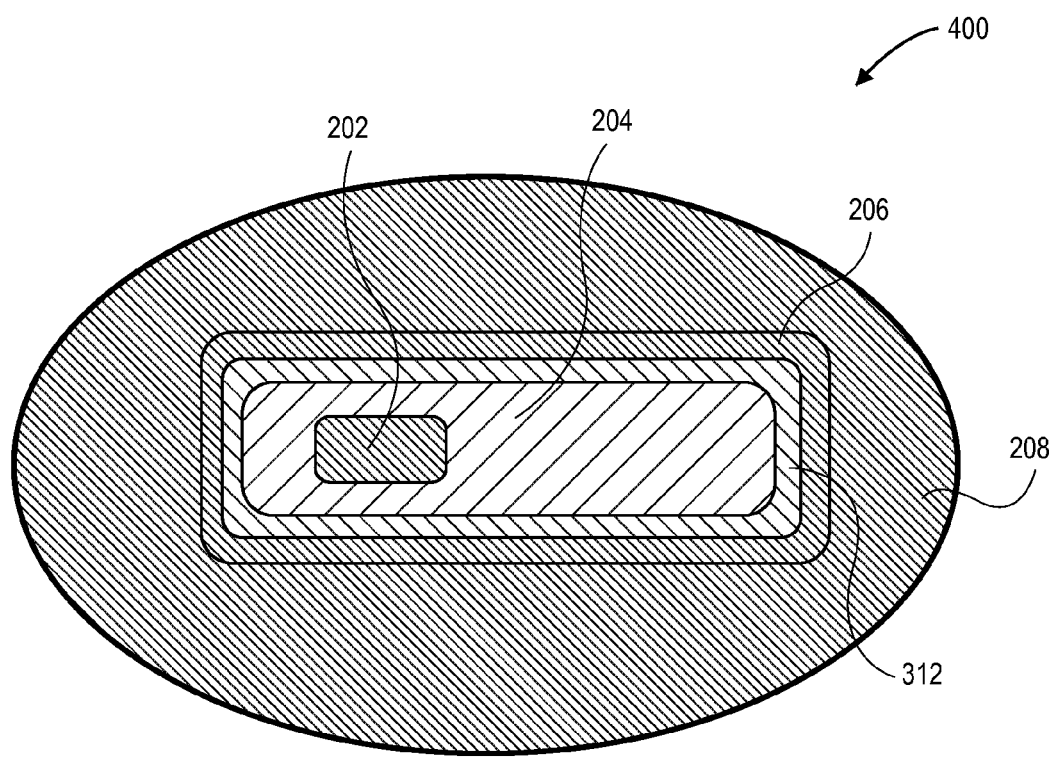
FIG. 4 illustrates a cross-sectional view of a semiconductor structure having a nano-crystalline core/nano-crystalline shell/nano-crystalline outer shell combination with one compositional transition layer, in accordance with an embodiment of the present invention.

Referring to FIG. 4, a semiconductor structure 400 includes the nano-crystalline core 202, nano-crystalline shell 204, and nano-crystalline outer shell 206 of structure 200. In addition, the semiconductor structure 400 includes the compositional transition layer 312 of structure 300 disposed between, and in contact with, the nano-crystalline shell 204 and the nano-crystalline outer shell 206. However, structure 400 does not include the compositional transition layer 210 of structure 200, i.e., there is no compositional transition layer between the core 202 and shell 204.

Referring to FIGS. 1-4, and as depicted in FIGS. 2-4, the structures 100, 200, 300 and 400 may further include an insulator coating (e.g., shown as 208 in FIGS. 2-4) surrounding and encapsulating the nano-crystalline core/nano-crystalline shell pairing or nano-crystalline core/nano-crystalline shell/nano-crystalline outer shell combination. In one such embodiment, the insulator coating is composed of an amorphous material such as, but not limited to, silica ($SiO_x$), titanium oxide ($TiO_x$), zirconium oxide ($ZrO_x$), alumina ($AlO_x$), or hafnia ($HfO_x$). In an embodiment, insulator-coated structures based on structures 100, 200, 300 and 400 are quantum dot structures. For example, structures 100, 200, 300 and 400 may be used as a down-converting quantum dot or an up-shifting quantum dot.

In another aspect, quantum dot composite compositions are described. For example, the quantum dots (including coated quantum dots) described above may be embedded in a matrix material to make a composite using a plastic or other material as the matrix. In an embodiment, composite compositions including matrix materials and silica coated core/shell quantum dots having photoluminescence quantum yields between 90 and 100% are formed. Such quantum dots may be incorporated into a matrix material suitable for down converting in LED applications such as LED lighting or LED displays.

Composites formed by conventional approaches typically suffer from non-uniform dispersion of quantum dots throughout the matrix material which can result in particle agglomeration. Agglomeration may be so severe as to result in emission quenching reducing light output. Another problem is lack of compatibility between the quantum dots and the matrix reduces composite performance. Lack of materials compatibility may introduce a discontinuity at the polymer/quantum dot interface where composite failure may initiate when it is deployed in ordinary use.

Accordingly, there remains a need for a composite material having a quantum dot composition in a matrix that is strong, resistant to thermal degradation, resistant to chemical degradation, provides good adhesion between the coated quantum dot and coupling agent and provides good adhesion between the coupling agent and the polymer matrix. Embodiments described below include quantum dots incorporated into composite matrixes to produce high refractive index films having a high PLQY suitable for solid state device lighting including light emitting diodes.

In an embodiment, an approach for incorporating quantum dots into matrix materials includes coating the quantum dot with a silica shell and reacting the silica shell with a silane coupling agent having two reactive functionalities under the proper conditions. Such an arrangement drives a condensation reaction, binding one end of the silane to the silica surface and leaving the other end of the molecule exposed for integration into a matrix. Other approaches include using a curable material such as metal oxide nanocrystals in a matrix material. In the curable material, metal oxide nanocrystals are linked to a polymer matrix via titanate or a zirconate coupling agents as well as a silane coupling agent, where the metal atoms of the coupling agent link to the oxygen atoms of the metal oxide nanocrystals. Since metal oxides generally do not have a higher refractive index, the curable material incorporating the metal oxide nanocrystals typically can not achieve a refractive index sufficient to improve the light extraction efficiency of photons emitted by an LED in a solid-state device. A high refractive index material including zinc sulfide (ZnS) in a matrix material is another approach attempted. In making the high refractive index material, ZnS colloids are synthesized with ligands having hydroxyl functional groups that are linked to isocyanate function groups present on an oligomer backbone in the matrix material.

In a general embodiment, a composite includes a matrix material. A plurality of semiconductor structures (e.g., quantum dot structures having a coated or non-coated core/shell pairing, such as the structures described above) is embedded in the matrix material. In an embodiment, a lighting apparatus includes a light emitting diode and a composite coating the light emitting diode. The composite may be formed by embedding quantum dots in a matrix material described below.

Figure 5A:
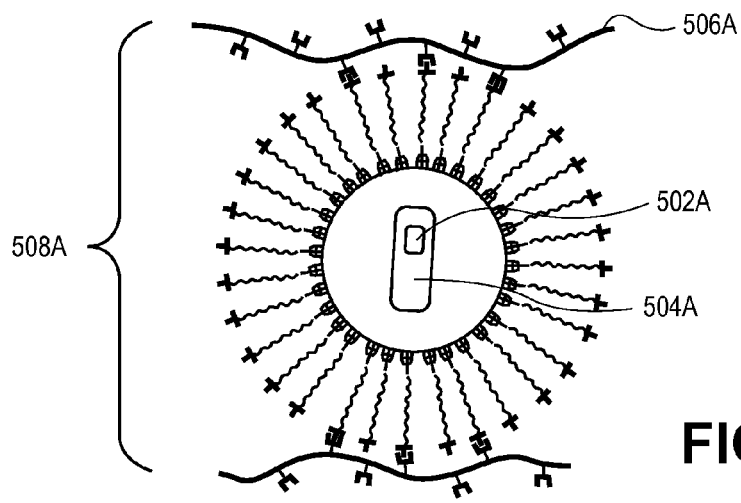
FIGS. 5A-5C illustrate schematic representations of possible composite compositions for quantum dot integration, in accordance with an embodiment of the present invention.
Figure 5B:
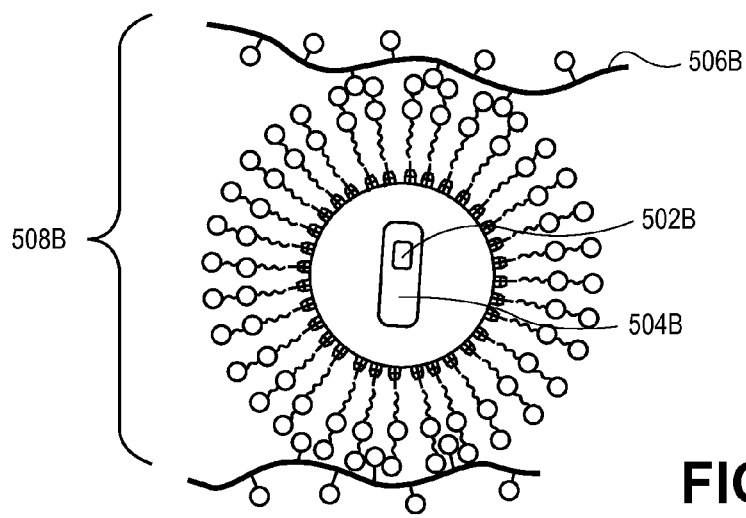
Figure 5C:
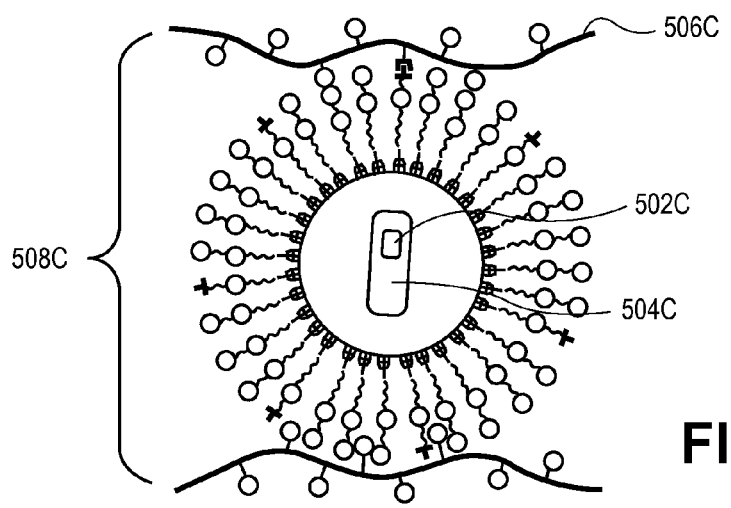

With reference to the above described composite, in an embodiment, each of the plurality of semiconductor structures is cross-linked with, polarity bound by, or tethered to the matrix material. In an embodiment, each of the plurality of semiconductor structures is bound to the matrix material by a covalent, dative, or ionic bond. By way of example, FIGS. 5A-5C illustrate schematic representations of possible composite compositions for quantum dot integration, in accordance with an embodiment of the present invention. Referring to FIG. 5A, a nanocrystalline core 502A and shell 504A pairing is incorporated into a polymer matrix 506A by active cross-linking through multiple and interchain binding to form a cross-linked composition 508A. Referring to FIG. 5B, a nanocrystalline core 502B and shell 504B pairing is incorporated into a polymer matrix 506B by polarity-based chemical similarity and dissolution to form a polarity based composition 508B. Referring to FIG. 5C, a nanocrystalline core 502C and shell 504C pairing is incorporated into a polymer matrix 506C by reactive tethering by sparse binding and chemical similarity to form a reactive tethering based composition 508C.

With reference again to the above described composite, in an embodiment, one or more of the semiconductor structures further includes a coupling agent covalently bonded to an outer surface of the insulator layer. For example, in one such embodiment, the insulator layer includes or is a layer of silica ($SiO_x$), and the coupling agent is a silane coupling agent, e.g., having the formula $X_nSiY_{4-n}$, where X is a functional group capable of bonding with the matrix material and is one such as, but not limited to, hydroxyl, alkoxy, isocyanate, carboxyl, epoxy, amine, urea, vinyl, amide, aminoplast and silane, Y is a functional group such as, but not limited to, hydroxyl, phenoxy, alkoxy, hydroxyl ether, silane or aminoplast, and n is 1, 2 or 3. In another embodiment, however, the coupling agent is one such as, but not limited to, a titanate coupling agent or a zirconate coupling agent. It is to be understood that the terms capping agent, capping ligand, ligand and coupling agent may be used interchangeably as described above and, generally, may include an atom, molecule or other chemical entity or moiety attached to or capable of being attached to a nanoparticle. Attachment may be by dative bonding, covalent bonding, ionic bonding, Van der Waals forces or other force or bond.

In the case that a silica surface of a silica coated quantum dot is modified using silane coupling agents having multiple functional moieties, coupling to the surface of the silica shell and coupling to a matrix material and/or other matrix additives may be enabled. Such an approach provides uniform dispersion throughout the composite matrix using as little effort (e.g., reaction energy) as possible. Stronger physical and/or chemical bonding between the silica coated quantum dots and the matrix resin occurs. Also, the silane coupling composition must be compatible with both the silica coated quantum dot, which is inorganic, and the polymer matrix, which may be organic. Without being bound by any particular theory or principle, it is believed that the silane coupling agent forms a bridge between the silica and the matrix resin when reactive functional groups on the silane coupling agent interact with functional groups on the surface of the silica and/or the matrix resin. Because the functional groups involved are typically polar in nature, the coupling agent tends to be hydrophilic and readily dispersed in an aqueous size composition.

Matrix materials suitable for embodiments of the present invention may satisfy the following criteria: they may be optically clear having transmission in the 400-700 nm range of greater than 90%, as measured in a UV-Vis spectrometer. They may have a high refractive index between about 1.0 and 2.0, preferably above 1.4 in the 400-700 nm range. They may have good adhesion to an LED surface if required and/or are sufficiently rigid for self-supporting applications. They may able to maintain their properties over a large temperature range, for example −40° C. to 150° C. and over a long period of time (over 50,000 hours at a light intensity typically 10-150 W/cm2 of 450 nm blue light).

Thus, with reference again to the above described composite, in an embodiment, the insulator layer is composed of a layer of silica ($SiO_x$), and the matrix material is composed of a siloxane copolymer. In another embodiment, the matrix material has a UV-Vis spectroscopy transmission of greater than 90% for light in the range of 400-700 nanometers. In an embodiment, the matrix material has a refractive index approximately in the range of 1-2 for light in the range of 400-700 nanometers. In an embodiment, the matrix material is thermally stable in a temperature range of −40-250 degrees Celsius. In an embodiment, the matrix material is composed of a polymer such as, but not limited to, polypropylene, polyethylene, polyesters, polyacetals, polyamides, polyacrylamides, polyimides, polyethers, polyvinylethers, polystyrenes, polyoxides, polycarbonates, polysiloxanes, polysulfones, polyanhydrides, polyamines, epoxies, polyacrylics, polyvinylesters, polyurethane, maleic resins, urea resins, melamine resins, phenol resins, furan resins, polymer blends, polymer alloys, or mixtures thereof. In one such embodiment, the matrix material is composed of a polysiloxane such as, but not limited to, polydimethylsiloxane (PDMS), polymethylphenylsiloxane, polydiphenylsiloxane and polydiethylsiloxane. In an embodiment, the matrix material is composed of a siloxane such as, but not limited to, dimethylsiloxane or methylhydrogen siloxane.

Additionally, with reference again to the above described composite, in an embodiment, the plurality of semiconductor structures is embedded homogeneously in the matrix material. In an embodiment, the composite further includes a compounding agent embedded in the matrix material. The compounding agent is one such as, but not limited to, an antioxidant, a pigment, a dye, an antistatic agent, a filler, a flame retardant, an ultra-violet (UV) stabilizer, or an impact modifier. In another embodiment, the composite further includes a catalyst embedded in the matrix material, the catalyst one such as, but not limited to, a thiol catalyst or a platinum (Pt) catalyst.

Accordingly, in an embodiment, a method of fabrication includes forming a plurality of semiconductor structures embedded in a matrix material (or embedding preformed semiconductor structures in a matrix material). In one such embodiment, embedding the plurality of semiconductor structures in the matrix material includes cross-linking, reactive tethering, or ionic bonding the plurality of semiconductor structures with the matrix material. In an embodiment, the method further includes surface-functionalizing an insulator layer for the semiconductor structures prior to embedding the plurality of semiconductor structures in the matrix material. In one such embodiment, the surface-functionalizing includes treating the insulator layer with a silane coupling agent. However, in an alternative embodiment, coated semiconductor structures are embedded in a matrix by using a ligand-free insulator layer.

In another embodiment, simple substitution at the surface of the silica coated quantum dots is effective for stable integration without undesired additional viscosity and is suitable to produce a low-viscosity product such as a silicone gel. In one embodiment of the present invention a composite incorporates quantum dots which crosslink with the matrix through silane groups and which possess an adequate number of silane groups in order to form an elastic network. In addition, adequate adhesion to various substrates is enabled. Furthermore, silicone-based matrixes may be used. A structure of such polymers may be obtained which form microstructures in the crosslinked composition, thereby yielding cross-linked polymer compounds with an excellent mechanical strength. Furthermore, because of the distribution of the reactive silane groups, a high elasticity may be obtained after cross-linking.

The above described semiconductor structures, e.g., quantum dots may be used to fabricate lighting devices. As such, one or more embodiments of the present invention are directed to lighting devices having highly luminescent quantum dots. The quantum dots may be used on their own with no further coating, may be coated such as coated anisotropic quantum dots, may be mixed with optional conventional phosphors, and/or may be included in a matrix material. As an example, each of the various configurations for quantum dots described above may be included in or used to fabricate a lighting device. Specific examples of lighting devices include, but are not limited to, a blue or ultra-violet (UV) light-emitting diode (LED) coated with a layer of anisotropic quantum dots, a visible LED (emitting green or yellow, for example) coated with a layer of anisotropic quantum dots which absorbs those wavelengths, an array of blue, UV, or visible LEDs covered with a disk or coating of anisotropic quantum dots and optional additional phosphors, a "cup" configuration which contains anisotropic quantum dots and optional additional phosphors, a thin layer of quantum dots and optional additional phosphors mixed in a matrix conformally coating a blue LED, a sealed configuration where the quantum dots and optional additional phosphors are protected from the environment, a display backlight, a multicolor display component, or a monochromatic display component. Specific embodiments of such devices are described in greater detail below.

Figure 6:
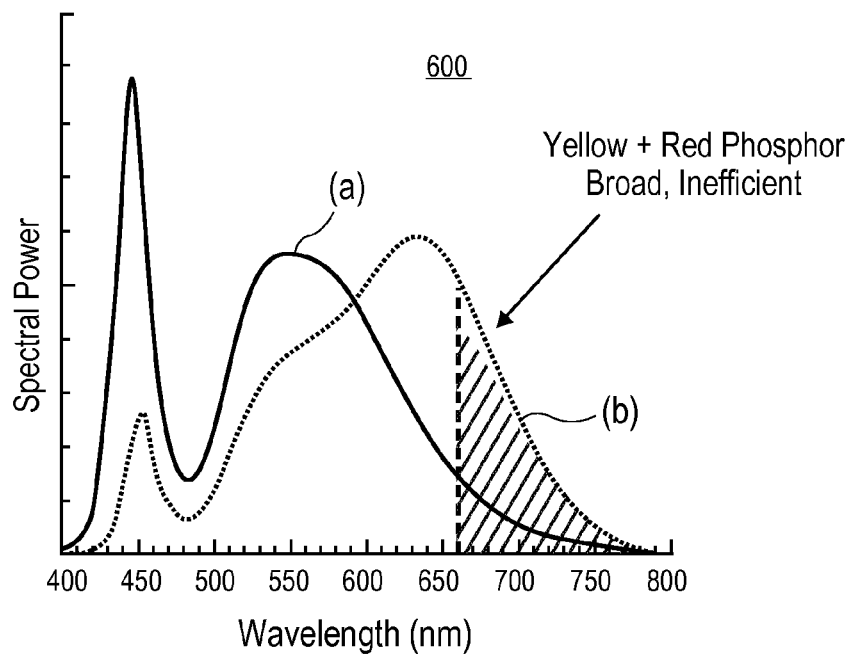
FIG. 6 is a plot of spectral power as a function of wavelength (nm) for a light-emitting diode (LED) coupled with (a) a yellow phosphor or (b) a combination of yellow and red phosphors.

Anisotropic quantum dot systems may provide numerous advantages over conventional approaches to lighting and display applications. By way of contrast, FIG. 6 is a plot 600 of spectral power as a function of wavelength (nm) for a light-emitting diode (LED) coupled with (a) a yellow phosphor or (b) a combination of yellow and red phosphors. Referring to plot 600, conventional red phosphors have a "tail" into the infra-red (IR) regime which is not visible to the eye. Accordingly, the photons in the IR range represent wasted energy, decreasing the conversion efficiency of the input LED light.

Figure 7:
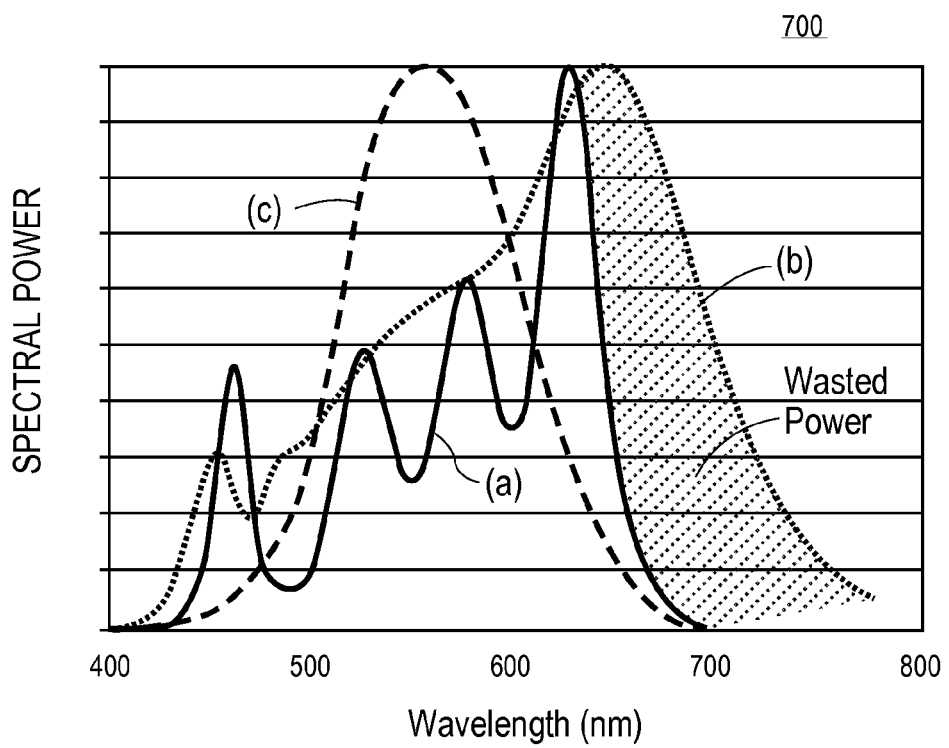
FIG. 7 is a plot of spectral power as a function of wavelength (nm) for (a) a blue light-emitting diode (LED) coupled with quantum dots of three colors to make white, in accordance with an embodiment of the present invention, and (b) a blue LED coupled with phosphors to make white, with eye response range provided by (c).

As a comparison of conventional approaches and those described herein, FIG. 7 is a plot 700 of spectral power as a function of wavelength (nm) for a blue light-emitting diode (LED) coupled with (a) three colors of quantum dots, in accordance with an embodiment of the present invention, and (b) two conventional phosphors, with eye response range provided by (c). Referring to plot 700, anisotropic quantum dots have a narrow emission which can be tailored to avoid loss of non-visible photons (e.g., curve (a) has a better overlap with the eye's response than curve (b)). Meanwhile, the preferred characteristics of the visible light are preserved, such as a high color rendering index (CRI) and warm color temperature. In one embodiment, at least three quantum dot (QD) colors in addition to the excitation wavelength provides the highest quality, highest efficiency warm white light, but in practice any number of quantum dot colors can be used.

Figure 8:
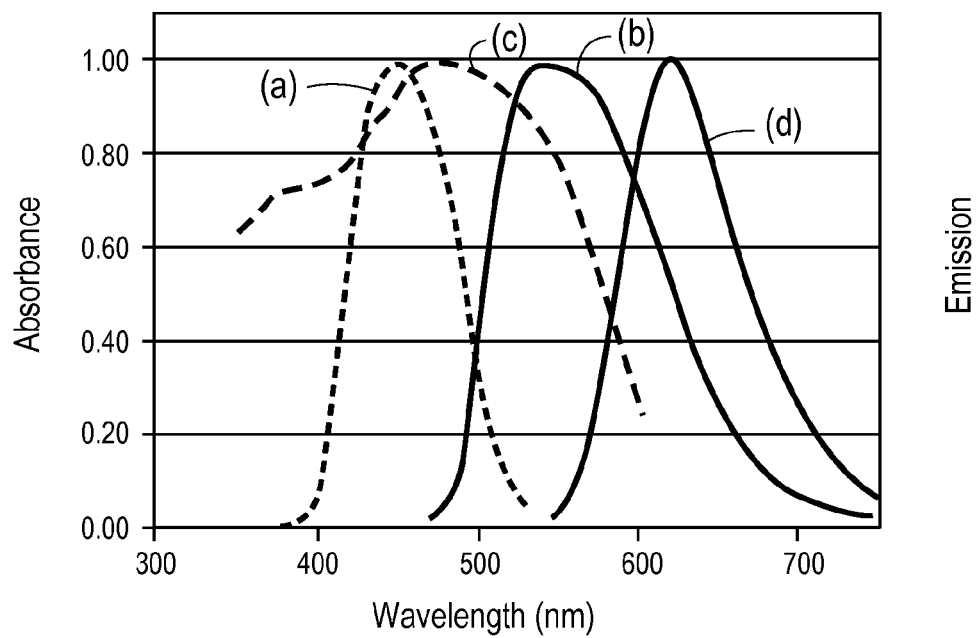
FIG. 8 is a plot of absorbance/emission as a function of wavelength (nm) for conventional phosphors where (a) and (b) are green absorbance and emission, respectively, and (c) and (d) are red absorbance and emission, respectively.
Figure 9:
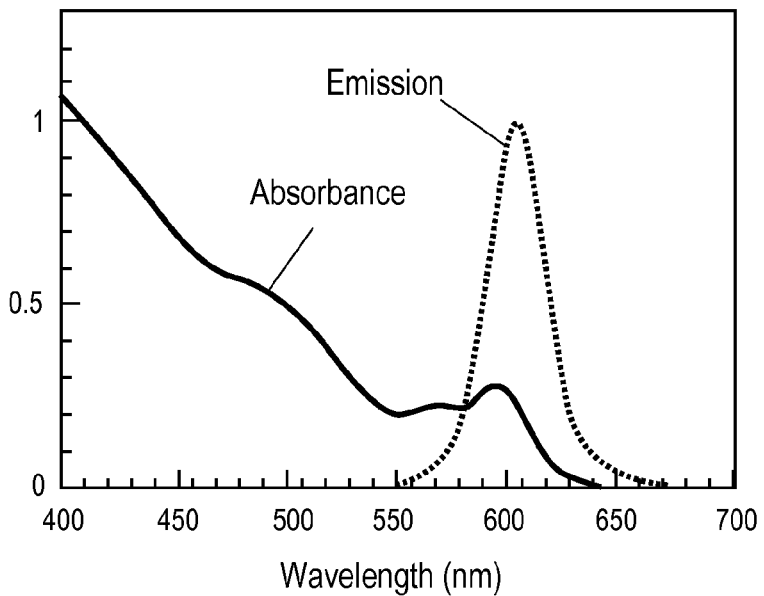
FIG. 9 is a plot of absorbance/emission as a function of wavelength (nm) for conventional quantum dots.

As further comparison of the advantages of using quantum dots such as those described herein for lighting and display devices, FIG. 8 is a plot 800 of absorbance/emission as a function of wavelength (nm) for conventional phosphors where (a) and (b) are green absorbance and emission, respectively, and (c) and (d) are red absorbance and emission, respectively. Referring to plot 800, for conventional phosphors, red absorbance overlaps with green emission. Other conventional approaches include the use of quantum dots which have considerable self absorption and also do not have the very high quantum yields of the high performance anisotropic quantum dots. As an example, FIG. 9 is a plot 900 of absorbance/emission as a function of wavelength (nm) for conventional quantum dots.

Figure 10:
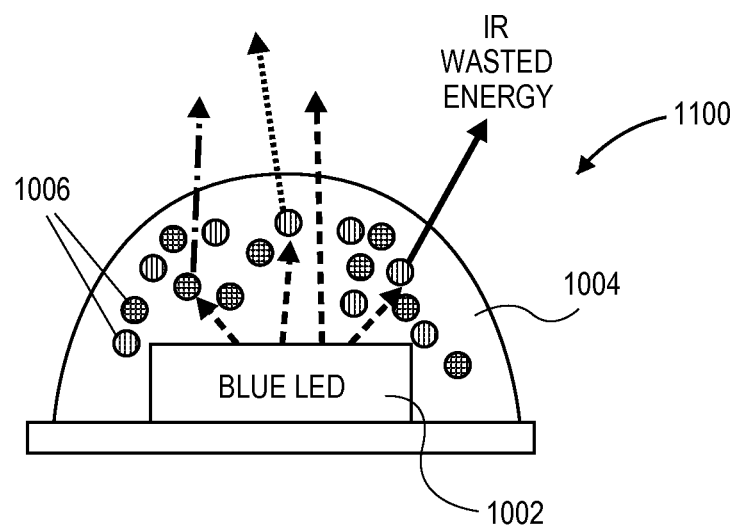
FIG. 10 illustrates a lighting device that includes a blue LED coated with a layer having rare earth phosphors therein.
Figure 11:
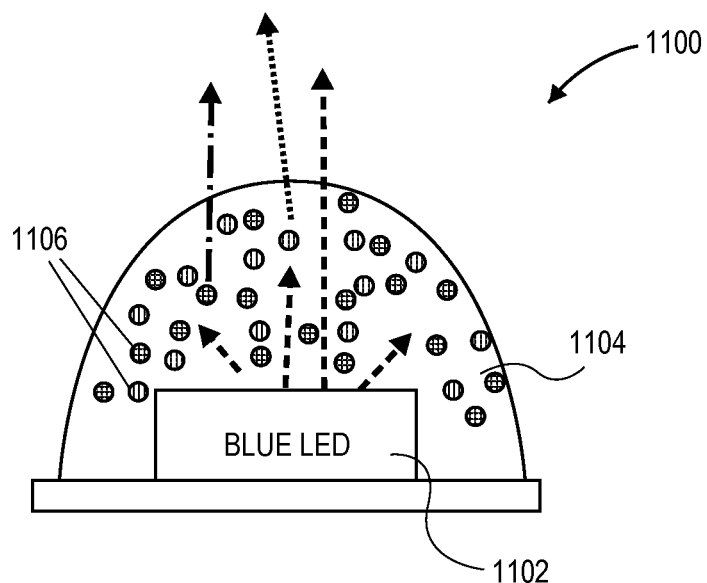
FIG. 11 illustrates a lighting device that includes a blue LED with a layer having anisotropic quantum dots therein, in accordance with an embodiment of the present invention.

With respect to illustrating the above concepts in a device configuration, FIGS. 10 and 11 illustrate lighting devices 1000 and 1100, respectively. Device 1000 includes a blue LED 1002 coated with a layer 1004 having rare earth phosphors 1006 therein. Device 1100 has a blue LED 1102 with a layer 1104 having anisotropic quantum dots 1106 therein (with optional additional conventional phosphors), in accordance with an embodiment of the present invention. Both devices 1000 and 1100 may be used to produce "cold" or "warm" white light. However, the device 1000 includes both yellow and red phosphors which may provide a broad and inefficient output. By contrast, in accordance with an embodiment of the present invention, the device 1100 has little to no wasted energy since there is little to no emission in the IR regime. In one such embodiment, the use of anisotropic quantum dots enables greater than approximately 40% lm/W gains versus conventional phosphors. In a specific such embodiment, increased efficacy is achieved, meaning increased luminous efficacy based on lumens (perceived light brightness) per watt electrical power. Accordingly, down converter efficiency and spectral overlap may be improved with the use of anisotropic quantum dots to achieve efficiency gains in lighting and display.

Figure 12:
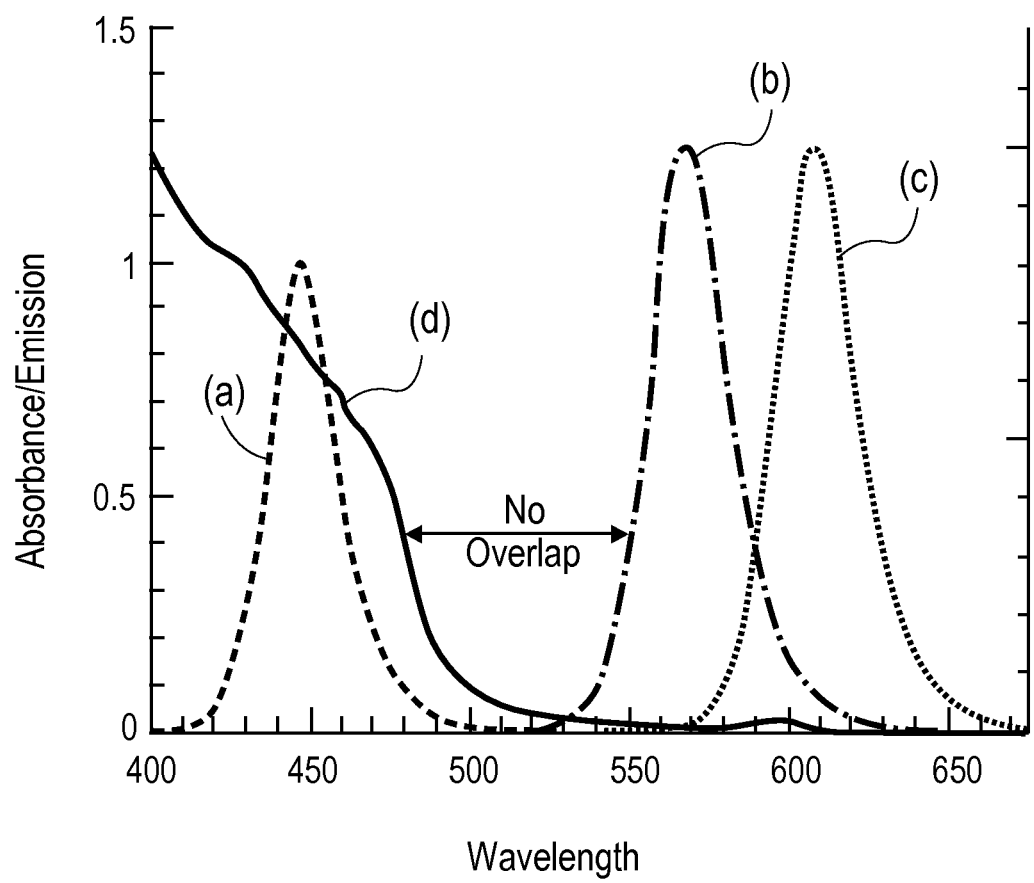
FIG. 12 is a plot of absorbance/emission spectra as a function of wavelength (nm) for (a) blue LED emission (b) green anisotropic quantum dot emission (c) red anisotropic quantum dot emission and (d) absorbance of the quantum dots of (b) and (c), in accordance with an embodiment of the present invention.

In another aspect, the use of anisotropic quantum dots with LEDs may provide further efficiency stemming from essentially little to no overlap between absorption and emission spectra. For example, FIG. 12 is a plot 1200 of absorbance/emission spectra as a function of wavelength (nm) for (a) blue LED emission (b) green anisotropic quantum dot emission (c) red anisotropic quantum dot emission and (d) absorbance of the quantum dots of (b) and (c), in accordance with an embodiment of the present invention. Referring to plot 1200, in an embodiment, the anisotropic quantum dots described herein, regardless of color emission, have the same absorption edge for all emission wavelengths.

Figure 13:
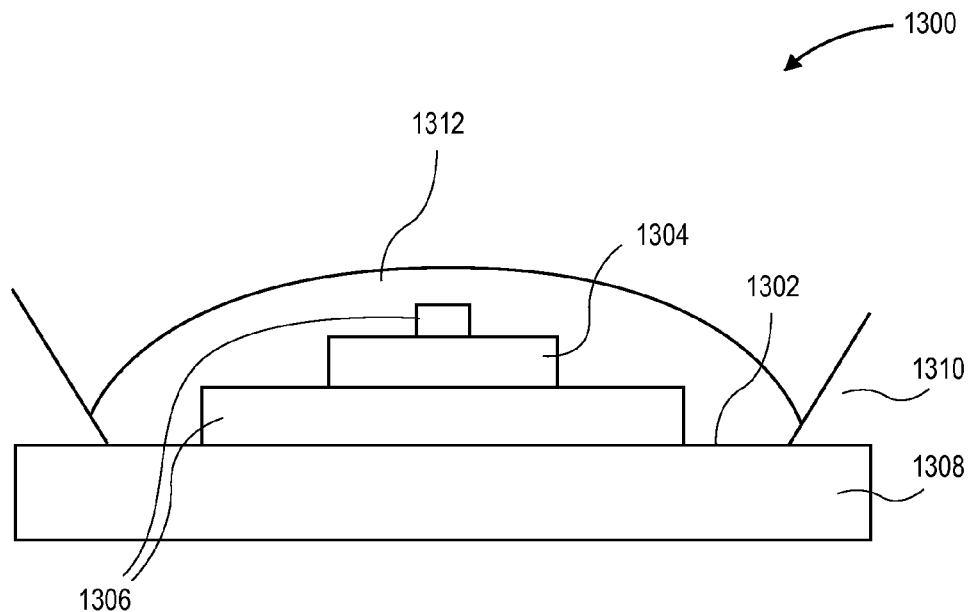
FIG. 13 illustrates a cross-sectional view of a lighting device, in accordance with an embodiment of the present invention.

Different approaches may be used to provide a quantum dot layer in a lighting device. In an example, FIG. 13 illustrates a cross-sectional view of a lighting device 1300, in accordance with an embodiment of the present invention. Referring to FIG. 13, a blue LED structure 1302 includes a die 1304, such as an InGaN die, and electrodes 1306. The blue LED structure 1302 is disposed on a coating or supporting surface 1308 and housed within a protective and/or reflective structure 1310. A matrix layer 1312 is formed over the blue LED structure 1302 and within the protective and/or reflective structure 1310. The matrix layer 1312 includes anisotropic quantum dots or a combination of anisotropic quantum dots and conventional phosphors. Although not depicted, the protective and/or reflective structure 1310 can be extended upwards, well above the matrix layer 1312, to provide a "cup" configuration.

Since quantum dots are not scattering to visible light, and in some cases scattering is desired for reasons such as color uniformity and increased out-coupling, scattering elements such as silica particles can also be added to the matrix 1312 with the quantum dots.

Figure 21:
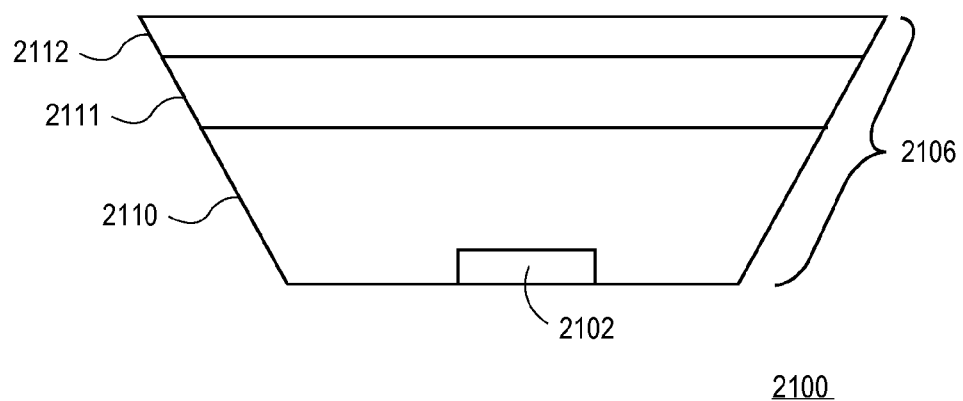
FIG. 21 illustrates a cross-sectional view of a lighting device, in accordance with an embodiment of the present invention.

In other embodiments, and as illustrated by embodiment 2100 in FIG. 21, it may be desirable to layer the matrix 2103 formed over the blue LED structure 2102 and within the protective and/or reflective structure, with each layer 2110, 2111, and 2112, contributing a different color of the visible spectrum using phosphors or quantum dots, or another function such as scattering or sealing from the environment.

Figure 14:
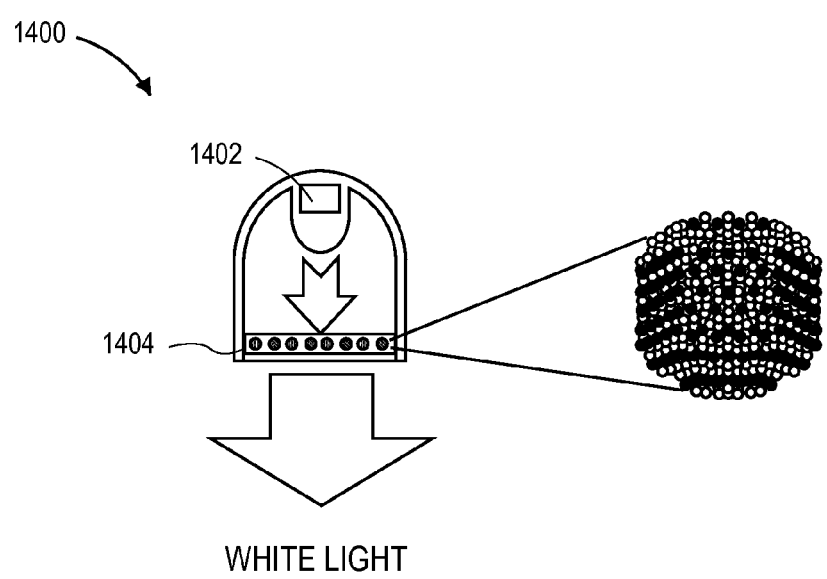
FIG. 14 illustrates a cross-sectional view of a lighting device, in accordance with another embodiment of the present invention.

In another example, FIG. 14 illustrates a cross-sectional view of a lighting device 1400, in accordance with another embodiment of the present invention. Referring to FIG. 14, the lighting device 1400 includes a blue LED structure 1402. A quantum dot down converter screen, or conversion layer, 1404 is positioned somewhat remotely from the blue LED structure 1402. The quantum dot down converter screen 1404 includes anisotropic quantum dots, e.g., of varying color (i.e., size), or a combination of anisotropic quantum dots and conventional phosphors. In one embodiment, the device 1400 may be used to generate while light, as depicted in FIG. 14.

Figure 15:
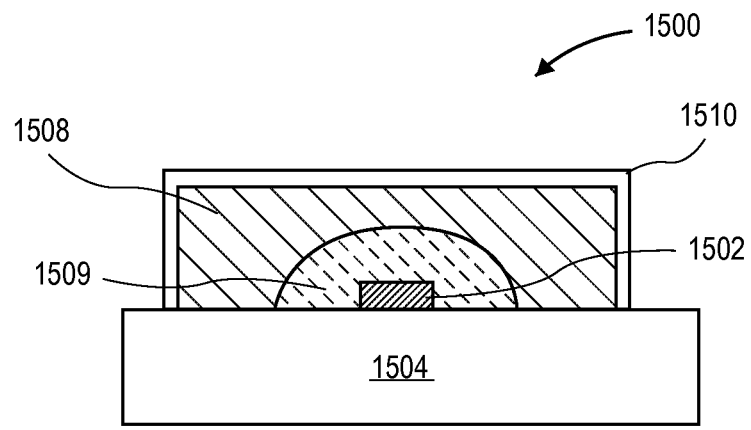
FIG. 15 illustrates a cross-sectional view of a lighting device, in accordance with another embodiment of the present invention.

In another example, FIG. 15 illustrates a cross-sectional view of a lighting device 1500, in accordance with another embodiment of the present invention. Referring to FIG. 15, the lighting device 1500 includes a blue LED structure 1502 supported on a substrate 1504 which may house a portion of the electrical components of the blue LED structure 1502. A first light conversion layer 1506, such as a matrix layer, includes red-light emitting anisotropic quantum dots. A second light conversion layer 1508, such as a second matrix layer, includes quantum dots or green or yellow phosphors or a combination thereof (e.g., yttrium aluminum garnet, YAG phosphors). Optionally, a sealing layer 1510 may be formed over the second conversion layer 1508, as depicted in FIG. 15. In one embodiment, the device 1500 may be used to generate while light.

Figure 16:
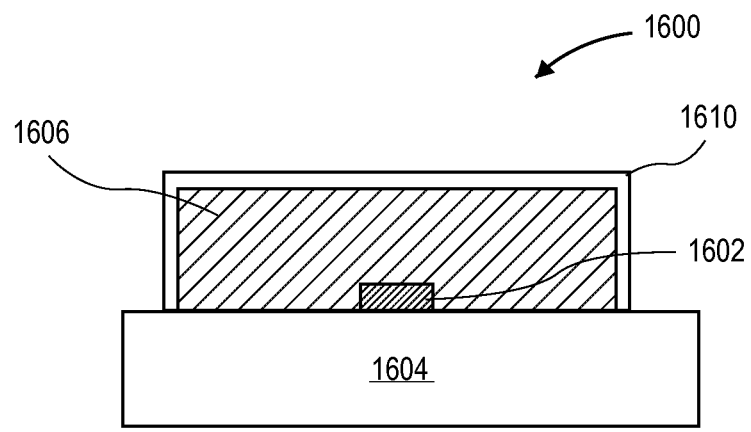
FIG. 16 illustrates a cross-sectional view of a lighting device, in accordance with another embodiment of the present invention.

In another example, FIG. 16 illustrates a cross-sectional view of a lighting device 1600, in accordance with another embodiment of the present invention. Referring to FIG. 16, the lighting device 1600 includes a blue LED structure 1602 supported on a substrate 1604 which may house a portion of the electrical components of the blue LED structure 1602. A single light conversion layer 1606, such as a matrix layer, includes red-light emitting anisotropic quantum dots in combination with green anisotropic quantum dots or green and/or yellow phosphors. Optionally, a sealing layer 1610 may be formed over the single conversion layer 1506, as depicted in FIG. 16. In one embodiment, the device 1600 may be used to generate white light.

Figure 17A:
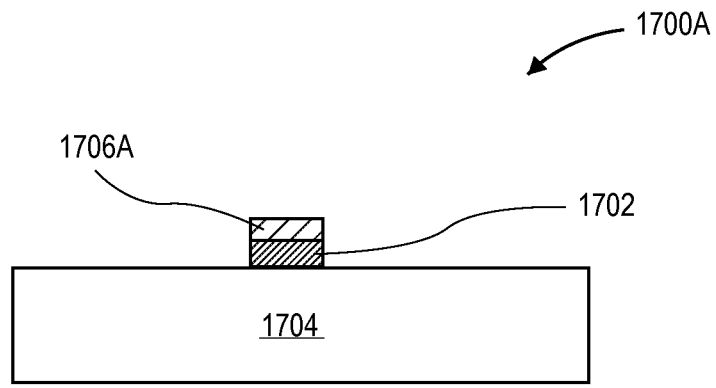
FIGS. 17A-17C illustrate cross-sectional views of various configurations for lighting devices, in accordance with another embodiment of the present invention.
Figure 17B:
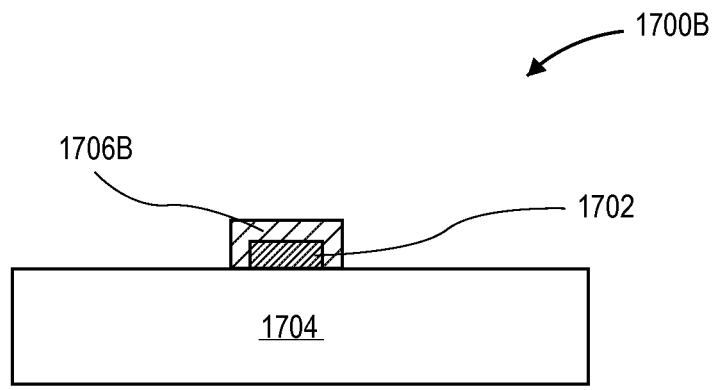
Figure 17C:
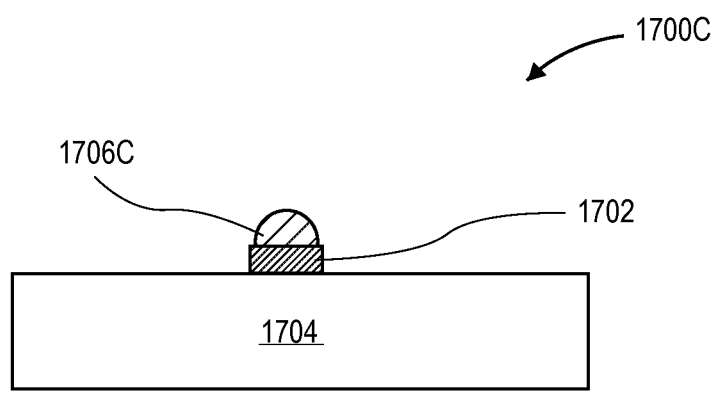

In additional examples, FIGS. 17A-17C illustrate cross-sectional views of various configurations for lighting devices 1700A-1700C, respectively, in accordance with another embodiment of the present invention. Referring to FIGS. 17A-17C, the lighting devices 1700A-1700C each include a blue LED structure 1702 supported on a substrate 1704 which may house a portion of the electrical components of the blue LED structure 1702. A conversion layer 1706A-1706C, respectively, such as a matrix layer, includes one or more light-emitting color types of anisotropic quantum dots. Referring to FIG. 1700A specifically, the conversion layer 1706A is disposed as a thin layer only on the top surface of the blue LED structure 1702. Referring to FIG. 1700B specifically, the conversion layer 1706B is disposed as a thin layer conformal with all exposed surfaces of the blue LED structure 1702. Referring to FIG. 1700C specifically, the conversion layer 1706C is disposed as a "bulb" or lens only on the top surface of the blue LED structure 1702.

In another embodiment of the invention, combinations of minimally-self absorbing quantum dots may be used to achieve very specific emission profiles. Each quantum dot has a narrow emission profile. However, by using combinations of quantum dots with different emission profiles, it is possible to achieve a desired or selected emission spectrum. For example, an embodiment may mimic the blackbody radiation curve, or a narrow emission spectrum for an amber automobile taillight, etc.

Collodial quantum dots are semiconductor nanocrystals that are noted for their narrow spectral emission profiles and tunability. The emission spectrum for the quantum dots can be tuned by simply changing the size of the nanocrystal. In this way there are no solution compatibility issues with different colors of quantum dots in that they are the same materials, but simply present in different sizes and/or with different semiconductor compositions (including alloys). By combining quantum dots with varying emission wavelengths at desired ratios in the combination, an appropriate sum, or total, emission spectrum can be achieved, offering a distinct advantage over traditional phosphors where the emission spectra are much broader, thus severely liming the types of sum spectra that can be produced.

Figure 18:
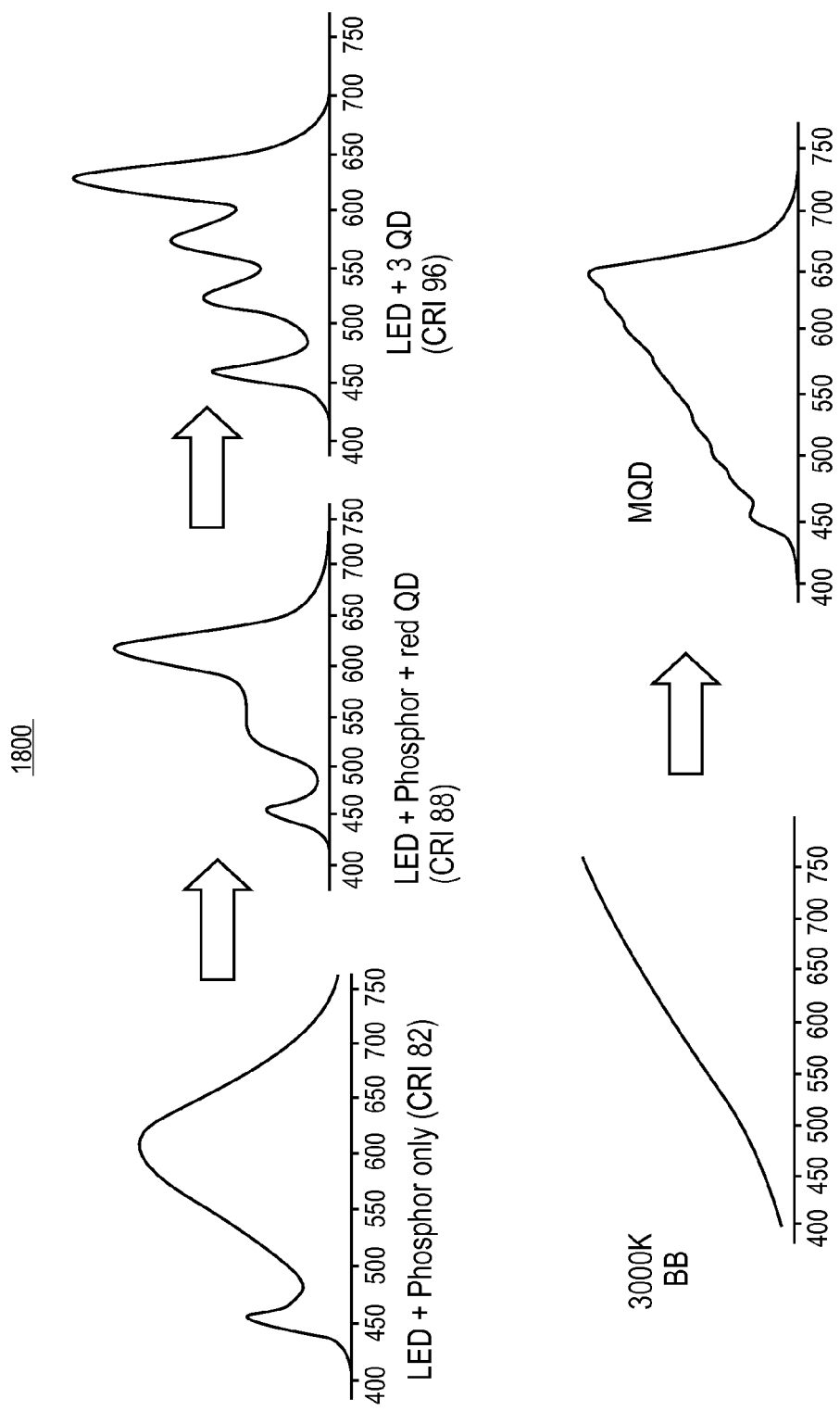
FIG. 18 illustrates example desired emission spectrum that may be achieved with embodiments of the invention using quantum dot down-conversion phosphor materials that are both tunable and have a narrow spectral emission profile.

One embodiment of the invention utilizes quantum dots which are uniquely suited for being combined, as described above, in LED applications, because the quantum dots are robust, mixable with silicones, and most importantly, have very low self-absorption due to their fixed absorption onset. One embodiment only begins to absorb strongly in the region where the blue LED emits, roughly around 450 nm. The emission occurs in the visible spectrum, between approximately 480 nm and 650 nm. Therefore photons which are emitted are very unlikely to be re-absorbed, and so a high conversion efficiency of blue to visible photons is maintained. The lack of re-absorption makes the embodiment well suited for complex combinations of quantum dots such as those shown at 1800 in FIG. 18.

One embodiment of the invention incorporates a premeasured mixture of multiple quantum dots in an matrix material such as silicone, that, when cured and illuminated by a blue LED light source, converts the blue LED light to a white light source of any desired CCT or CRI for which the mixture is designed. This mixture can be applied directly to an LED chip, or positioned in a remote configuration relative to the LED chip, as an optical element in a module, lamp, or luminaire separated from the chip, as illustrated in, and described above with reference to, FIG. 7.

Embodiments of the invention allow a quantum dot manufacturer to mix and ship a turnkey solution (for example, a quantum dot mixture to achieve 3000K:CRI 90, or 4500:CRI 85) to an LED or luminaire manufacturer thereby relieving the LED or luminaire manufacturer of the task of phosphor sourcing, qualifying, mixing and adjusting to hit a specific color point. For example, a quantum dot manufacturer may ship a premeasured mixture of multiple quantum dots in a matrix material in a concentrated form to be added to other encapsulant or matrix materials by a customer, or in a diluted ready-to-use form that the customer applies as-is. One embodiment of the invention contemplates replacing all phosphor-converted LEDs with quantum dot converted LEDs.

Various embodiments of the invention prevent excessive temperatures that otherwise degrade performance in, and lifetime of, a downconverter such as quantum dots used to create white or colored light from a blue or UV-LED light. Such embodiments may do so by 1) limiting the optical flux density, thereby reducing the heat generation per unit area due to Stokes loss, and/or 2) removing heat generated from the downconverter material. In a high-power LED device that has downconverter material deposited directly to the LED chip surface such as in FIGS. 15-17, flux density is necessarily very high, and self-heating is therefore significant. The primary path for heat dissipation in such embodiments is through the LED chip itself which, may already operate at a hot temperature. Downconverter temperatures can thus approach 150° C. When optical flux density is reduced by moving the downconverter away from the chip and enlarging its surface area in a remote configuration as in FIG. 14, the downconverter then has relatively poor heatsinking ability because it is typically suspended in air, for example, on a transparent substrate. The primary heatsinking in such an embodiment occurs through convective cooling by the air, as well as minor cooling along the relatively poorly conductive transparent substrate to the edges of the mount. In addition, the larger surface area of the light conversion layer requires a larger quantity of costly downconverter material in this case.

Figure 20:
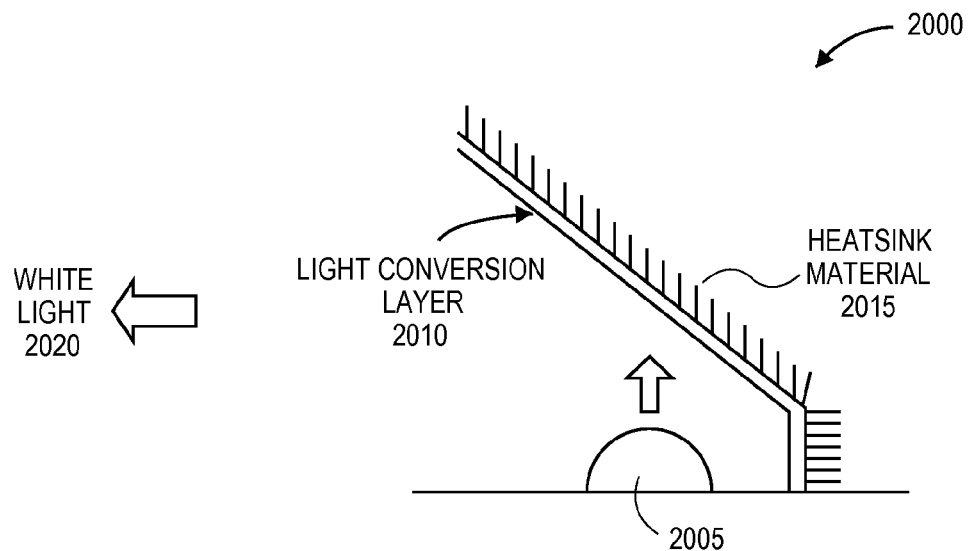
FIG. 20 illustrates an embodiment of the invention.

With reference to FIG. 20, one embodiment 2000 avoids these issues by depositing the light conversion layer 2010, i.e., the downconverter quantum dot material mixed into a matrix such as silicone, onto a surface of a reflective, thermally conductive heatsink 2015, such as a metal or ceramic material, that is in close proximity to the blue or UV LED or laser 2005. Such an embodiment allows direct heatsinking of the downconverter material to a heatsink that is much cooler than the LED chip itself, and control of the surface area of the downconverter to optimize cost and performance tradeoffs. Although the embodiment depicted in FIG. 20 illustrates the downconverter surface substantially at a given angle with the surface of the LED chip, in other embodiments, the downconverter surface may be of various shapes and at various angles to the LED, for example, to effect white light extraction in a desired direction 2020. In one embodiment, the surface under the downconverter matrix can be made to be diffusively or specularly reflective by a number of well-known methods before application of the material. This embodiment also has the advantage of allowing mixing and matching of pre-made downconverters to specific LEDs to obtain color-point control.

Figure 19:
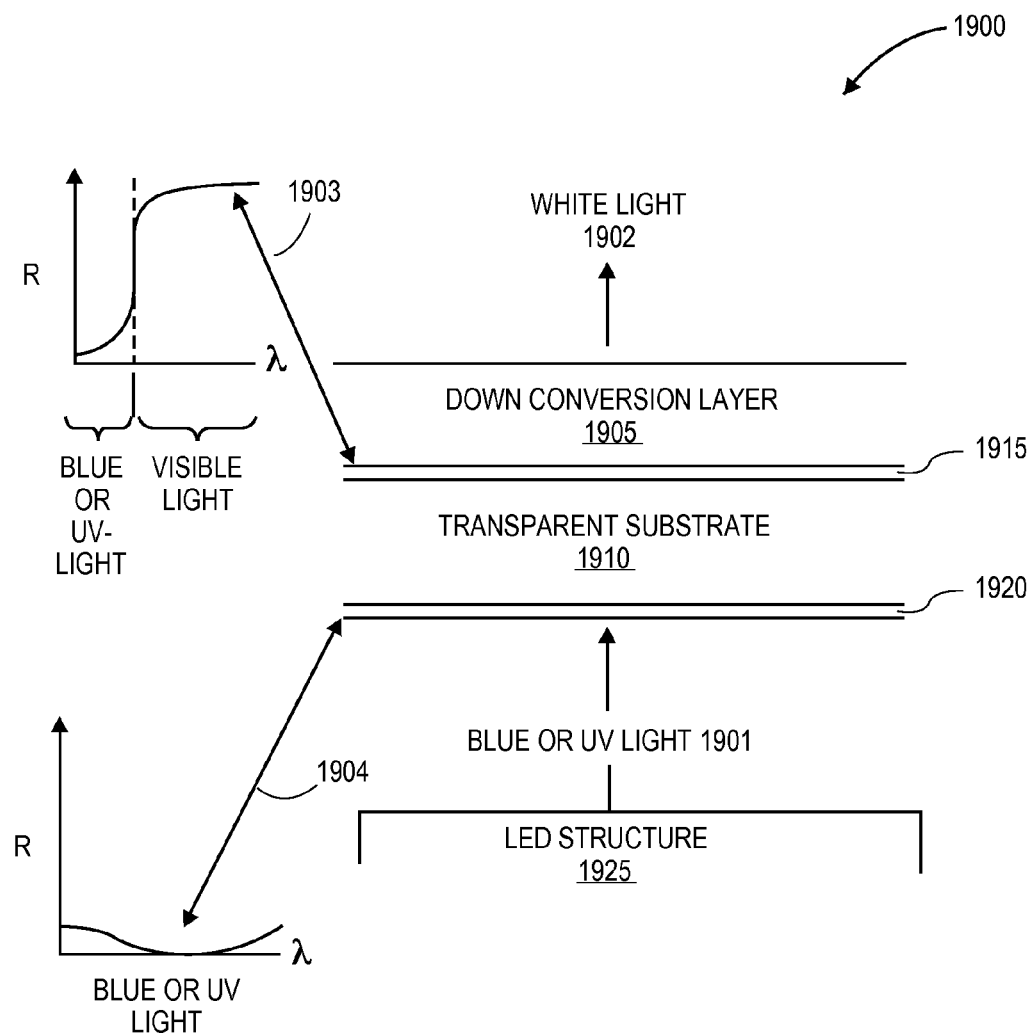
FIG. 19 illustrates an embodiment of the invention.

Additionally, in a remote downconverter embodiment for white-light LED lighting a transparent substrate/disc 1910 such as glass or plastic is coated as-is with a downconverter material 1905 such as phosphors and/or quantum dots suspended in silicone. Light 1901 emitted from a blue or UV LED source 1925 to the remote downconverter results in isotropic emission backward as well as in a forward direction. Any backward-emitting or -reflected or -scattered light is undesirable and should be reflected in the forward direction again to increase efficiency of the LED device. This may be accomplished by mounting the transparent substrate on a reflective mixing chamber but in doing so multiple lossy reflections can occur. In order to avoid these losses, one embodiment such as embodiment 1900 illustrated in FIG. 19 involves optically coating a surface of the substrate on the far side of the LED light, as depicted at 1915, so that it is anti-reflective for the blue or UV LED light and highly reflective for all other visible wavelengths 1903, e.g, white light 1902. Thus, the wavelengths emitted by the blue or UV LED pass straight through to the downconverter material 1905 coated on the outside of the substrate 1910, and any downconverted light emitted in the backward direction is reflected forward from the surface of the substrate. In one embodiment, the side of the substrate proximate, or facing, the LED chip, is coated with a coating 1920 that is anti-reflective for the wavelength emitted from the LED chip, as depicted at 1904.

Thus, lighting devices having highly luminescent quantum dots have been disclosed. In the above examples, although use with a blue LED is emphasized, it is to be understood that anisotropic quantum dots may be used with other light sources as well, including LEDs other than blue LEDs.

What is claimed is:

1. A lighting apparatus, comprising:
   a housing structure;
   a light source supported within the housing structure; and
   a light conversion layer disposed above the light source, the light conversion layer comprising a plurality of non- or low-self absorbing quantum dots (QDs) embedded in a matrix material, each QD having a different light emission profile that is a function of a size and composition of the QD, each of the plurality of QDs selected to achieve a defined spectral emission profile for the lighting device when the plurality of QDs is illuminated by the light source.

2. The lighting device of claim 1, wherein the light source is selected from one of a group of light sources consisting of: a light emitting diode (LED) light source, a blue LED light source, an LED chip-based light source, and a ultraviolet (UV) LED light source.

3. The lighting device of claim 1, wherein the light conversion layer is adjacent to the light source.

4. The lighting device of claim 1, wherein the light conversion layer is an optical element in one of a module, lamp, or luminaire, that is separate and remote from the light source.

5. The lighting device of claim 1, further comprising a reflective, thermally conductive heatsink, wherein the light conversion layer is deposited onto a surface of the heatsink.

6. The lighting device of claim 4, wherein the optical element comprises a transparent substrate.

7. The lighting device of claim 5, wherein the heatsink is proximate to the light source.

8. The lighting device of claim 5, wherein the surface of the heatsink is diffusively or specularly reflective.

9. The lighting device of claim 5, wherein the light conversion layer is coated with an anti-reflective coating.

10. The lighting device of claim 6, wherein a surface of the transparent substrate that is proximate the light source is coated with a coating that is anti-reflective of blue light or ultraviolet (IV) light emitted from the light source.

11. The lighting device of claim 6, wherein a surface of the transparent substrate that is facing away from the light source is optically coated to be anti-reflective of blue light or ultraviolet (UV) light emitted from the light source and highly reflective of all other light in the visible emission spectrum of the lighting apparatus's defined spectral emission profile.

12. The lighting device of claim 7, wherein the surface of the heatsink is positioned at an angle to the light source.

13. A multiple quantum dot (QD) device, comprising:
    a matrix material; and
    a plurality of non- or low-self absorbing quantum dots (QDs) mixed in the matrix material, each QD having a different light emission profile that is a function of a size of the QD and a composition of the QD, each of the plurality of QDs selected to achieve a defined spectral emission profile for a lighting device in or near which the QD device is to be installed.

14. The device of claim 13, further comprising a transparent substrate to which the matrix material is deposited.

15. The device of claim 13, further comprising a reflective, thermally conductive heatsink, wherein the matrix material is deposited onto a surface of the heatsink.

16. The device of claim 14, wherein a surface of the transparent substrate that is to be proximate a light source in the lighting device is coated with a coating that is anti-reflective of blue light or ultraviolet (UV) light emitted from the light source.

17. The device of claim 14, wherein a surface of the transparent substrate that is to be facing away from a light source in the lighting device is optically coated to be anti-reflective of blue light or ultraviolet (UV) light emitted from the light source and highly reflective of all other light in the visible emission spectrum of the lighting devices's defined spectral emission profile.

18. The device of claim 15, wherein the surface of the heatsink is diffusively or specularly reflective.

* * * * *